United States Patent
Boggs et al.

(10) Patent No.: US 7,325,303 B2
(45) Date of Patent: Feb. 5, 2008

(54) THREE-DIMENSIONAL FLEXIBLE INTERPOSER

(75) Inventors: David W. Boggs, Hillsboro, OR (US); John H. Dungan, Hillsboro, OR (US); Frank A. Sanders, Beaverton, OR (US); Daryl A. Sato, Portland, OR (US); Dan Willis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/635,965

(22) Filed: Dec. 8, 2006

(65) Prior Publication Data

US 2007/0082512 A1   Apr. 12, 2007

Related U.S. Application Data

(62) Division of application No. 10/749,818, filed on Dec. 31, 2003, now Pat. No. 7,201,583.

(51) Int. Cl.
*H01R 43/16* (2006.01)

(52) U.S. Cl. .......................... 29/874; 29/878; 29/879; 29/884; 439/591

(58) Field of Classification Search .................. 29/840, 29/874, 878, 879, 884; 439/591
See application file for complete search history.

(56) References Cited

U.S. PATENT DOCUMENTS

| | | | |
|---|---|---|---|
| 4,548,451 A * | 10/1985 | Benarr et al. | 439/85 |
| 5,427,535 A | 6/1995 | Sinclair | |
| 5,477,611 A * | 12/1995 | Sweis et al. | 29/840 |
| 5,738,531 A | 4/1998 | Beaman et al. | |
| 5,759,047 A * | 6/1998 | Brodsky et al. | 439/66 |
| 5,802,699 A | 9/1998 | Fjelstad et al. | |
| 5,977,618 A * | 11/1999 | DiStefano et al. | 257/674 |
| 6,133,639 A * | 10/2000 | Kovac et al. | 257/778 |
| 6,507,113 B1 | 1/2003 | Fillion et al. | |
| 6,525,429 B1 * | 2/2003 | Kovac et al. | 257/778 |
| 2003/0129866 A1 | 7/2003 | Romano et al. | |

\* cited by examiner

*Primary Examiner*—Carl J. Arbes
(74) *Attorney, Agent, or Firm*—Blakely, Sokoloff, Taylor & Zafman LLP

(57) ABSTRACT

A generally planar interposer having a plurality of interposer contact pads to contact a plurality of first contacts of a first electronic device on one side of the interposer, and a plurality of electrical connections between the interposer contact pads and a plurality of pressure contacts on the other side of the interposer. Each of the pressure contacts having a directionally deformable contact surface to removably contact a plurality of second contacts of a second electronic device on the other side of the interposer. Also methods of forming the interposer.

19 Claims, 8 Drawing Sheets

THREE-DIMENSIONAL FLEXIBLE INTERPOSER

CROSS REFERENCE TO RELATED APPLICATIONS

This application is a divisional of U.S. application Ser. No. 10/749,818 filed Dec. 31, 2003, titled "Three-Dimensional Flexible Interposer", now U.S. Pat. No. 7,201,583 issued Apr. 10, 2007.

FIELD

Electronic device connectors and attachments, and the manufacture thereof.

BACKGROUND

Electronic devices having a field or array of contacts are typically connected to other similar devices using molded socket devices, spring clip devices, or other mechanical packaging devices that cause the field or array of contacts of one device to individually contact or register with the field or array of contacts of the other device. Moreover, it is often necessary to permanently connect the contacts of such devices together for proper use. For example, a relatively expensive, separate, molded socket device, or device having "spring clips" is typically used to connect a land grid array (LGA) of a microprocessor, digital processor, or other integrated circuit device to a printed circuit board (PCB). In addition, such current designs may register or attach contacts individually, may not allow the LGA to be removed, may require selective gold plating on the PCB contacts, may not be permanently attached to the PCB, may not directly attach the LGA to the PCB, and/or may cause attachment of the LGA to the PCB to be difficult.

BRIEF DESCRIPTION OF THE DRAWINGS

Embodiments are illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

Figure 1:
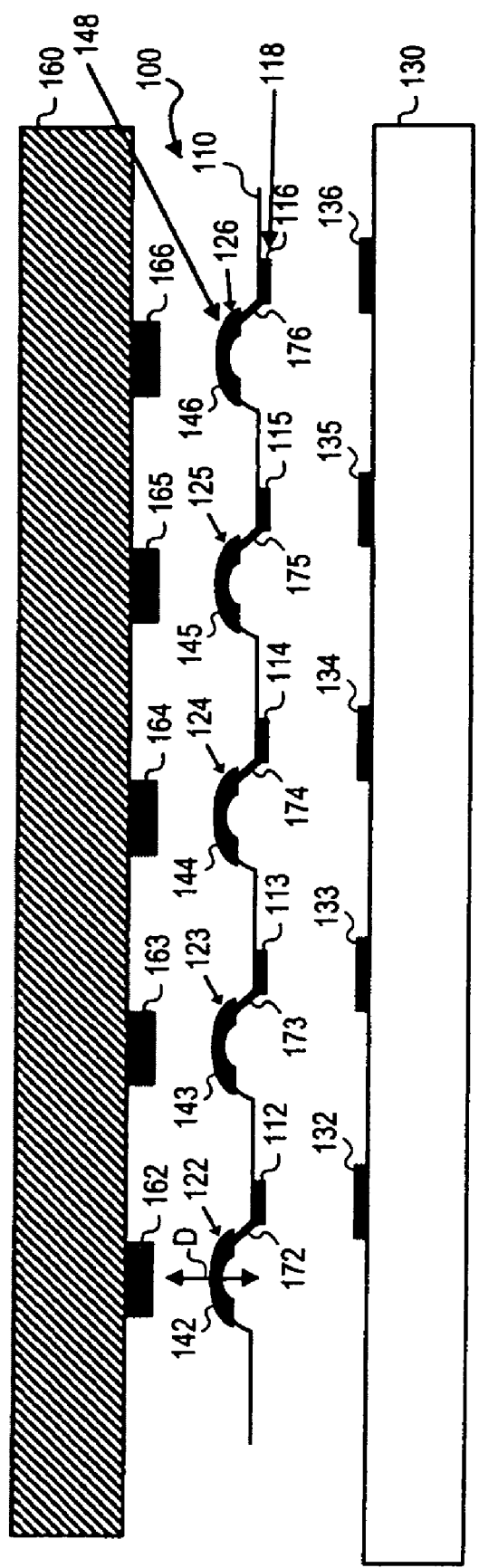
FIG. 1 is a schematic cross section view of an interposer for connecting a first electronic device to a second electronic device.

FIG. 1 is a schematic cross section view of an interposer for connecting a first electronic device to a second electronic device. FIG. 1 shows apparatus 100, which may generally be referred to as an interposer or flexible three dimensional two sided circuit component for electronically connecting a first electronic device to a second electronic device for a variety of styles and applications. Apparatus 100 has interposer contact pads 112, 113, 114, 115 and 116 on first side 118 of generally planar interposer 110 and pressure contacts 122, 123, 124, 125, and 126 formed on and including interposer 110 and having contact surfaces 142, 143, 144, 145, and 146 on second side 148 of interposer 110. In accordance with embodiments, interposer contact pads 112 through 116 may contact first contacts 132, 133, 134, 135, and 136 of first electronic device 130, such as by forming permanent or removable electrical connections or attachments. Likewise, pressure contacts 122 through 126 and contact surfaces 142, 143, 144, 145, and 146 may form removable or permanent electrical connections or attachments to contacts of another electronic device, such as by removably contacting second contacts 162, 163, 164, 165, and 166 of second electronic device 160. FIG. 1 also shows electrical connections 172, 173, 174, 175, and 176 between interposer contact pads 112 through 116 and pressure contacts 122 through 126.

For example, pressure contacts 122 through 126 and contact surfaces 142 through 146 may be directionally deformable in direction D to and from second side 148 or contact surface 142 towards and away from first side 118 or first contact 132. Moreover, electrical connections 172 through 176 may also be directionally deformable in direction D as described above. Thus, apparatus 100 may be configured (e.g., such as by selecting the proper materials and geographic layout for interposer 110, pressure contacts 122 through 126, electrical connections 172 through 176, and interposer contact pads 112 through 116) to simultaneously physically align (e.g., such as alignment with respect to direction D) and simultaneously electronically connect first contacts 132 through 136 with second contacts 162 through 166 (e.g., such as by allowing apparatus 100 to be placed or disposed with respect to first device 130 and second device 160 to allow first contacts 132 through 136 and second contacts 162 through 166 to be registered via physical attachment and electrical connection through apparatus 100).

For example, according to embodiments, apparatus 100 may be used to removably contact contacts or contact pads of second electronic device 160, such as a land grid array (LGA), a main grid array, an integrated circuit, a semiconductor device, a digital processor, and/or a memory module or chip. Similarly, apparatus 100 may be used to removably or permanently contact or be electronically attached to contacts or contact pads of first device 130, such as a PCB, an electronic board having conductive traces, a computer electronic board, a "mother board", and/or a memory module or chip board. Thus, apparatus 100 may be disposed between a first and second electronic device having a land pattern, grid, array, or other suitable geographic layout of electronic contacts or contact pads.

Figure 2:
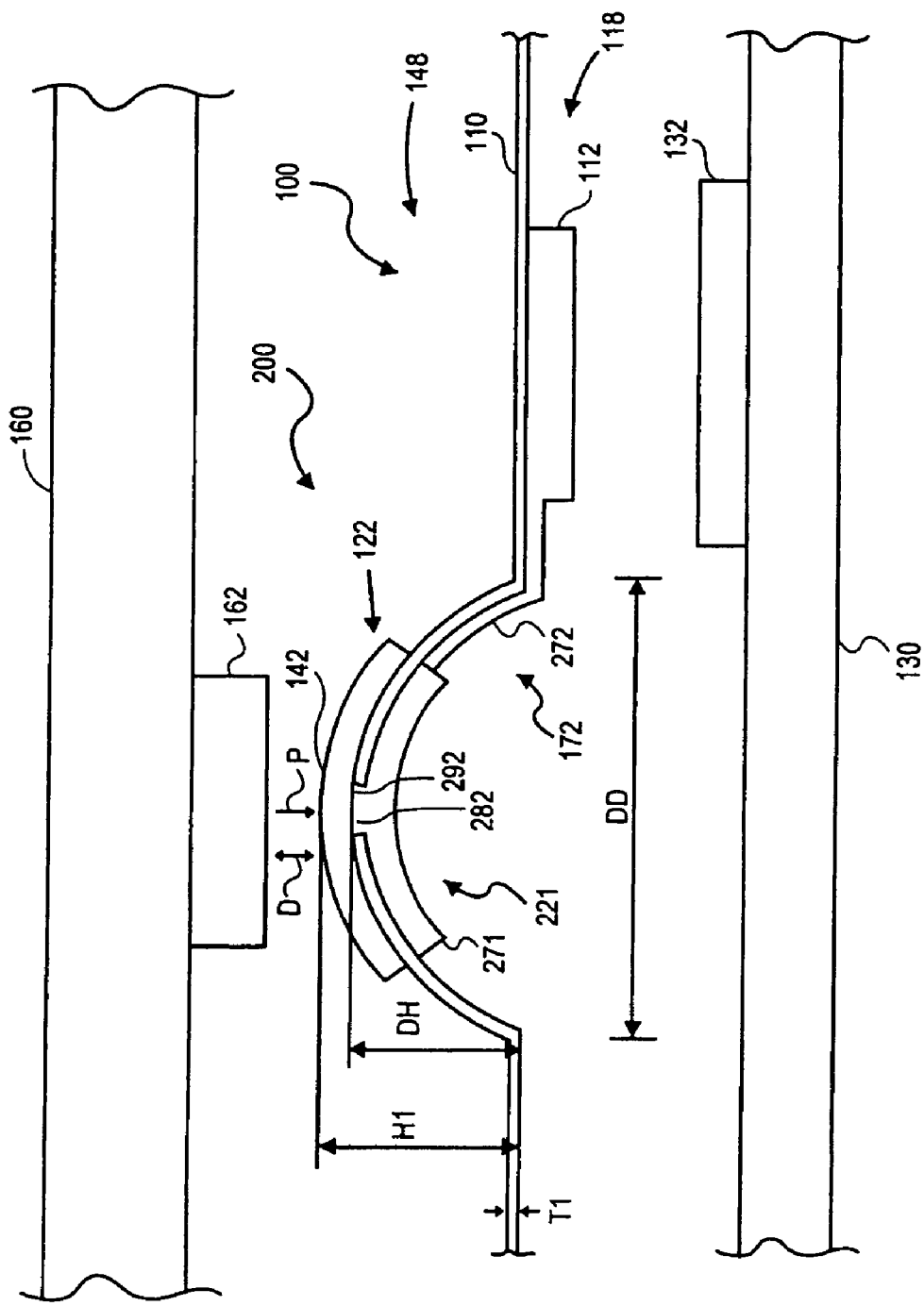
FIG. 2 is a schematic cross section view of a structure including a dome shaped pressure contact for connecting a contact of a first electronic device to a contact of a second electronic device.

In order to provide a more detailed view of pressure contact 122, FIG. 2 is a schematic cross section view of a structure including a dome shaped pressure contact for connecting a contact of a first electronic device to a contact of a second electronic device. FIG. 2 shows structure 200 including pressure contact 122 and three dimensional dome 221 with dome height DH and dome diameter DD formed in generally planar interposer 110 under pressure contact 122. For example, dome height DH may be a height of between four mils and 250 mils in distance from a top surface of contact surface 142 to a bottom surface of interposer 110, and dome diameter DD may be a diameter of between five mils and 50 mils in diameter, as shown in FIG. 2.

Also, FIG. 2 shows electrical connection 172 having conductive connection 282 disposed in hole 292 extending from first side 118 to second side 148 of interposer 110. Generally planar interposer 110 has first thickness T1. Thus, electrical connection 172 and conductive connection 282 may be sufficient to provide electrical conductivity between contact surface 142 and interposer contact pad 112 for electronic functionality of first and second electronic device 130 and 160 such as by allowing sufficient Watts in power to be transferred from first contact pad 132 to second contact pad 162 through apparatus 100 for proper operation of second electronic device 160, as described above.

According to embodiments, dome 221 and/or pressure contact 122 may define shapes other than a dome, such as by defining a cone, a bubble, a dimple, a depression, an indentation, a hemispherical shape, or various other appropriate shapes having a height above a hollow or vacant region and providing an elasticity as described herein. Specifically, for example, pressure contact 122 may be a pressure contact similar to that used in an electronic device remote control (e.g., such as a television or video cassette recorder remote control) or a telephone keypad. Thus, pressure contact 122 may have a first height H1 of between four mils and 250 mils in distance from a top surface of contact surface 142 and a bottom surface of interposer 110 as shown in FIG. 2. Note that first height H1 as described above and shown in FIG. 2 is a representative height.

FIG. 2 also shows electrical connection 172 including trace 272 electronically connecting interposer contact pad 112 to trace pad 271 on first side 118. Trace pad 271 is in turn electronically connected to pressure contact 122 via electronically conductive connection 282 disposed through hole 292. For example, conductive connection 282 may be a plated through hole or a conductive filler disposed in hole 292. Furthermore, according to embodiments, electrical connection 172, trace pad 271, trace 272, and conductive connection 282 may be selected to include materials and to have a geographic layout sufficient to form an appropriate electronically conductive path between interposer contact pad 112 and contact surface 142 of pressure contact 122 as described herein. For example, trace 272, trace pad 271, conductive connection 282, and pressure contact 122 may be formed of a conductive material (e.g., such as copper, gold, silver, aluminum, titanium, alloy, and/or a metal) having a sufficient electronically conductive path, location, thickness, elasticity, and durability selected to survive flexing or being directionally deformed in direction D in response to pressure P as described herein. Thus, such selections may be made to minimize trace stress caused by forming pressure contact 122, such as during formation of dome 221, and during pressure P applied to pressure contact 122 at contact surface 142, as described below.

Specifically, dome diameter DD, dome height DH, interposer material (e.g., such as a plastic material used to form interposer 110, having a selected elasticity), and first thickness T1 may be selected to have sufficient characteristics to allow dome 221 and pressure contact 122 to flex, such as in direction D, in response to a pressure P having a maximum of, for example, between 0.1 Newton and 1.0 Newton (e.g., such as a pressure of 0.4 Newton) in pressure applied to pressure contact 122 without permanently deforming or damaging dome 221 and/or pressure contact 122.

Thus, structure 200 shown in FIG. 2 (e.g., and similar structures of apparatus 100), or a structure other than a dome (e.g., such as alternate structures described above for pressure contact 122 and dome 221), but having sufficient materials and structure may be selected to withstand a maximum selected value of pressure P, as described above, such as by having a modulus of elasticity greater than the maximum pressure, force, or strain expected at contact surface 142.

Figure 3:
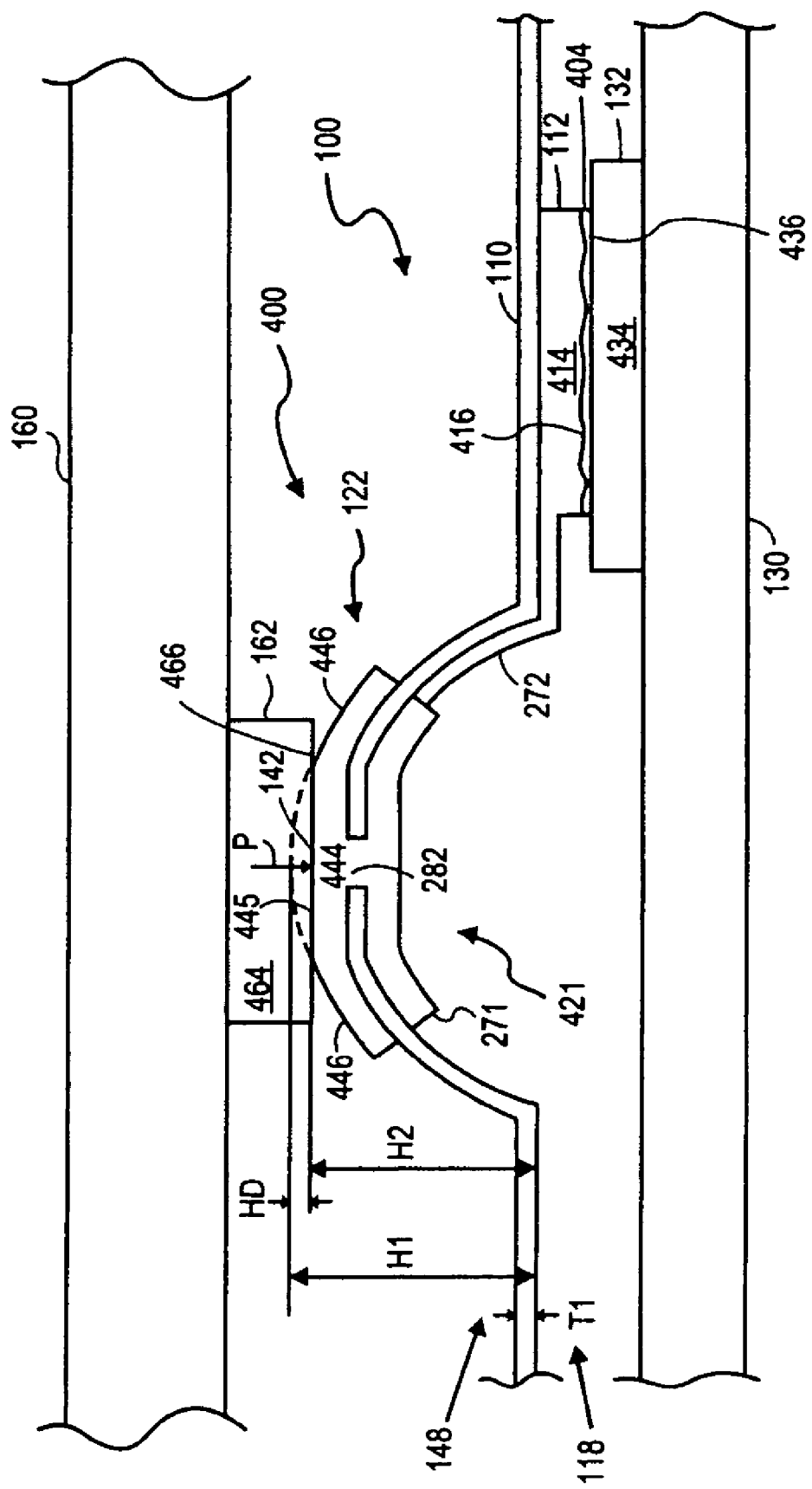
FIG. 3 is a schematic cross section view of a structure including a dome shaped pressure contact complying under a contact pressure applied by the contact of an electronic device.

For example, FIG. 3 is a schematic cross section view of a structure including a dome shaped pressure contact complying under a contact pressure applied by the contact of an electronic device. FIG. 3 shows structure 400 having pressure contact 122, complying or flexing under contact pressure P applied to contact surface 142 as described above, without permanently deforming or damaging pressure contact 122 and/or without permanently deforming or damaging trace 272, trace pad 271, conductive connection 282, interposer 110, or contact surface 142.

For instance, structure 400 may represent structure 200, as shown in FIG. 2, after pressure P is applied to contact surface 142 (e.g., such as one of multiple structure of apparatus 100). Thus, structure 200 and pressure contact 122 may have a property such that when pressure P is applied to a top surface of pressure contact 122, such as contact surface 142, pressure contact 122 flexes to second height H2 (e.g., a distance in height from the top surface of contact surface 142 to a bottom surface on first side 118 of interposer 110) while pressure P is applied, wherein second height H2 is less than first height H1 by a height difference HD between 0 mils and 10 mils in distance. It is contemplated that height difference HD may be a distance between 1 mils and 10 mils, such as a distance between two mils and five mils, in height. Note that second height H2 and height difference HD as described above and shown in FIG. 3 are representative heights.

Consequently, according to embodiments, structure 200 and/or structure 400 (e.g., such as a structure having pressure contact 122, trace 272, trace pad 271, conductive connection 282, contact surface 142, and interposer 110 forming dome 221 or 421) may have a modulus of elasticity greater than pressure P such that structure 200 and/or structure 400 (e.g., including pressure contact 122) can flex, comply, or be directionally deformable to and from first height H1 and second height H2 (e.g., between the shape of dome 221 and dome 421) without causing permanent deformation or damage to structure 200 and/or structure 400 and the components thereof. In other words, the shape of pressure contact 122, as described above, may transition in geometric shape between the shapes of structure 200 and structure 400 shown in FIGS. 2 and 3, such as by being temporarily modified in shape to the shape shown in FIG. 3 while pressure P is applied to contact surface 142 and returning to the shape shown in FIG. 2 when pressure P is removed from contact surface 142.

In order to provide such flexibility and elasticity, generally planar interposer 110 may include a layer or film having first thickness T1 of a material such as a polyamide, a polyester, a polycarbonate, a Mylar®, a polyvinyl chloride (PVC), a cellulose acetate, or a plastic material sufficient so that pressure contact 122 survives pressure P as described above. Moreover, it is contemplated that interposer 110 include an elastic material or a self-expanding material, such as a material having a shape memory where the memorized shape is the expanded shape, such that removing pressure P applied to contact surface 142 allows dome 421 to automatically expand to its approximate original shape of dome 221 prior to application of pressure P (e.g., the shape shown in structure 200).

According to embodiments, contact surface 142 may include conductor material 444, such as copper, gold, silver, or a conductor as described above with respect to trace 272, having attachment surfaces 445 and 446 plated or coated with a metal, such as plated with gold or silver. Similarly, interposer contact pad 112 may be an electrically conductive material 414 (e.g., similar to conductor material 444 described above) having attachment surface 416 with or without a metal coating or plating, such as with or without a plating of gold or silver. Likewise, first contact 132 may include conductive material 434 (such as described above with respect to conductive material 444) having attachment surface 436 with or without a metal coating or plating, such as with or without a plating of silver or gold. Thus, for example, if interposer contact pad 112 is removably attached to first contact 132, such as by pressure contact without solder, attachment surface 416 and/or attachment surface 436 may include a plating or coating as described above. Alternatively, if interposer contact pad 112 is permanently attached to first contact 132, such as by solder 404, attachment surface 416 and/or attachment surface 436 may be without or exclude a metal plating or coating, such as to form a sufficient solder connection between them without metal plating. More particularly, solder 404 may be a solder, conductive paste, and/or a conductive adhesive used during an assembly process of electronic devices, including processes using a solder mask, a solder bump, a conductive paste, a conductive adhesive, a solder paste, and/or a reflow electronic conductive technology technique.

According to embodiments, it is also contemplated that attachment surfaces 445/446 and attachment surface 466 may be conductive materials with or without electrically conductive coating as described above with respect to surfaces 416 and 436, such as to form a permanent or removable attachment between contact surface 142 and second contact 162. Hence, contacts on one side of apparatus 100 may be permanently attached to first electronic device 130, such as a PBA, during assembly processes of electronic devices. Furthermore, contacts on the other side of apparatus 100 may be configured such that apparatus 100 is or allows for removable direct attachment of an LGA (e.g., a second electronic device 160) to a PCB (e.g., a first electronic device 130) so that multiple LGAs may be switched onto and off of the PCB using apparatus 100.

Figure 4:
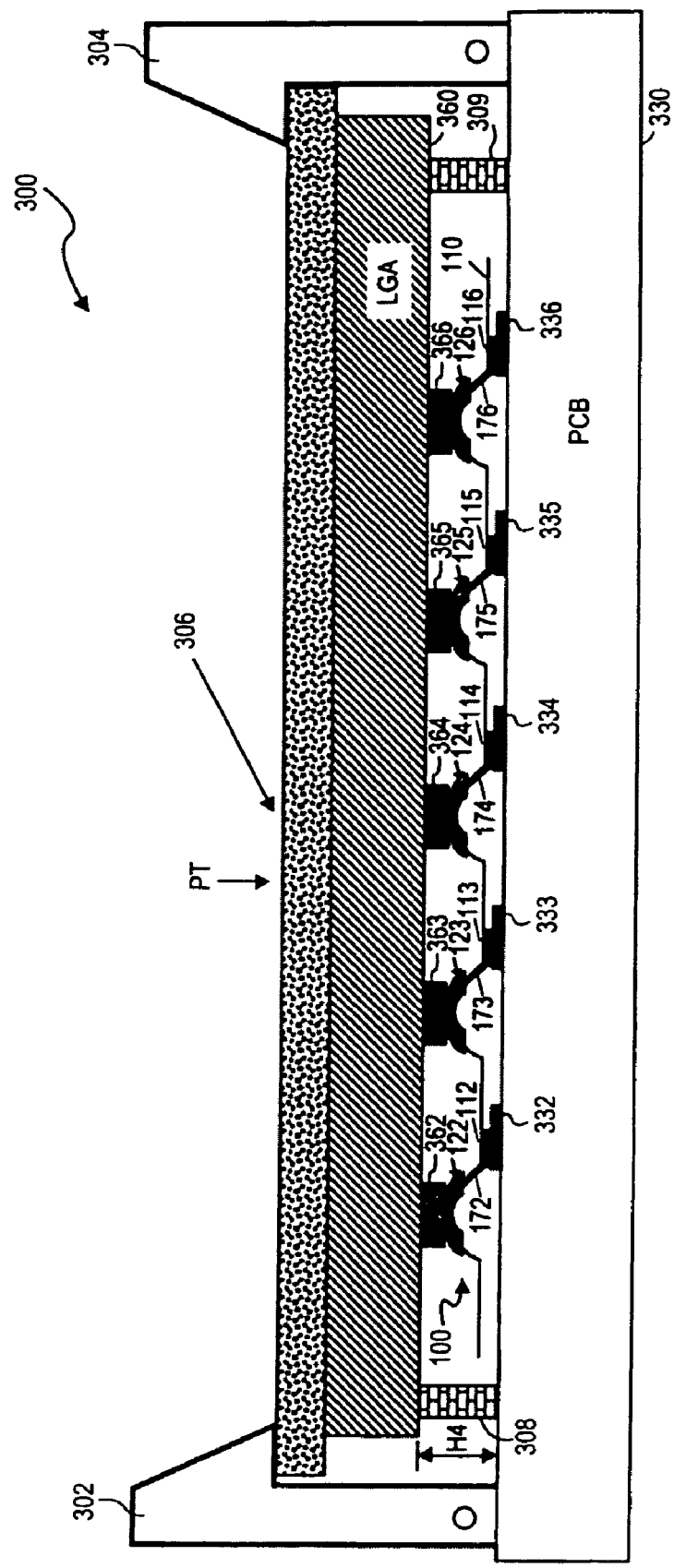
FIG. 4 is a schematic cross section view of an interposer removably connecting or attaching contacts of a LGA to contacts of a PCB.

It can be appreciated that for apparatus 100 as shown in FIG. 1, a pressure total that is the sum of pressure P applied to each contact surface 142 (e.g., of structure 200) can be calculated. Such a total pressure may represent the pressure incident upon contact surfaces 142 through 146 from a LGA that apparatus 100 is connecting to a PCB. For example, FIG. 4 is a schematic cross section view of an interposer removably connecting or attaching contacts of a LGA to contacts of a PCB. For instance, PCB 330 has first contact pads 332, 333, 334, 335, and 336 (e.g., which may have a geographic pattern of, or be part of a grid or array of contacts) and LGA 360 has second contact pads 362, 363, 364, 365, and 366 (e.g., which may have a geographic pattern of, or be part of a grid or array of contacts). FIG. 4 shows LGA 360 connected to PCB 330 via apparatus 100, where pressure total PT is visited upon LGA 360 by backing plate 306 and mechanical pressure fasteners 302 and 304 clamping backing plate 306 and LGA 360 to pressure total PT, such as a maximum compressive force associated with or selected by stand-off height H4 of stand-offs 308 and 309. It is also contemplated that structure 300 may include array registration pins and/or stand-off pins to define pressure total PT.

According to embodiments, apparatus 100 may be configured to simultaneously physically align and simultaneously electronically connect first contact pads 332, 333, 334, 335, and 336 of PCB 330 with second contact pads 362, 363, 364, 365, and 366 of LGA 360. For instance, pressure contacts 122-126 may have a pattern corresponding to a pattern of second contact pads 362-366 and interposer contact pads 112-116 may have a pattern corresponding to a pattern of first contact pads 332-336. Therefore, apparatus 100 can physically align contact pads of LGA 360 with those of PCB 330, such as by a visual alignment, an optical alignment, and/or a mechanical alignment. An example of a mechanical alignment may be where backing plate 306 and/or a backboard coupled to LGA 360 includes pins or other mechanical alignment features for engaging apparatus 100, mechanical pressure fasteners 302 and 304, stand-offs 308 and 309, and/or PCB 330 to align second contact pads 362-366, pressure contacts 122-126, interposer contact pads 112-116, and/or first contact pads 332-336.

Furthermore, in accordance with embodiments, apparatus 100 may be configured so that pressure contacts 122 through 126 removably electronically connect second contacts 362 through 366 via a removable or permanent connection between interposer contact pads 112 through 116 and first contacts 332 through 336, without connection sockets, pins, spring loaded connections, spring loaded connectors, leads, ball connections, solder balls, spring clips, and/or other packaging solutions. Furthermore, apparatus 100 may be configured as described herein so that height difference HD (e.g., of structure 200 and/or 400) is sufficient to eliminate or reduce any co-planarity issues between LGA 360 and PCB 330, such as those related to second contacts 362 through 366 and first contacts 332 through 336 not being in exact flat plane alignment with respect to each other.

Figure 5:
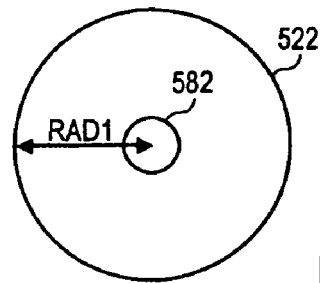
FIG. 5 is a schematic top view of an electrically conductive pad to be formed into a pressure contact.
Figure 6:
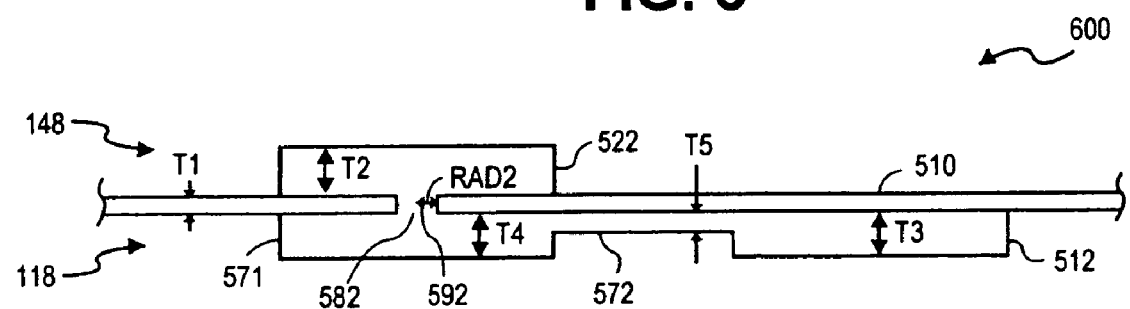
FIG. 6 is a schematic cross section view of an interposer having an electrically conductive pad formed on one side; a trace pad, trace, and interposer contact pad formed on another sides; and an electrical connection between the electrically conductive pad and the trace pad, prior to forming a pressure contact.
Figure 7:
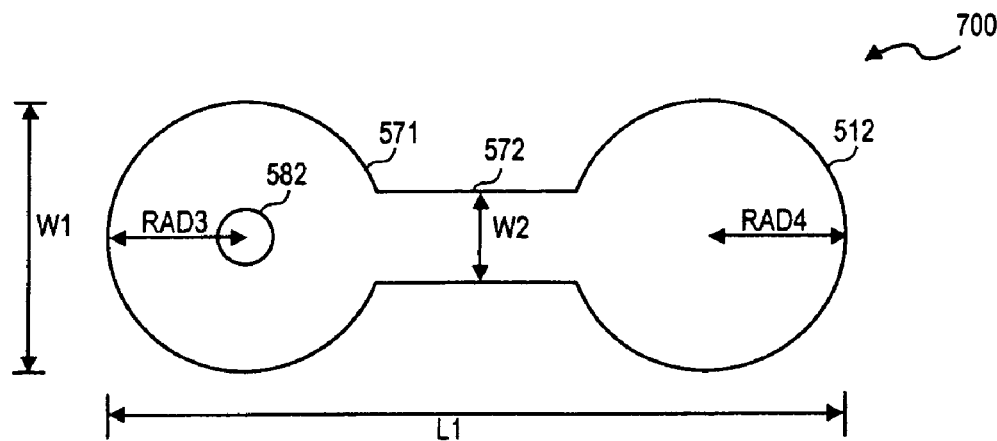
FIG. 7 is a top section view of a trace pad, trace, and interposer contact pad prior to forming a pressure contact.

Next, FIG. 5, FIG. 6, and FIG. 7 are used to illustrate structures 200 and/or 400 prior to forming first height H1 (e.g., of apparatus 100, such as those related to pressure contact 122). FIG. 5 is a schematic top view of an electrically conductive pad to be formed into a pressure contact. FIG. 5 shows electrically conductive pad 522 having RAD 1, such as an electrically conductive pad to be formed into pressure contact 122 having contact surface 142 (see FIG. 2). FIG. 5 also shows conductive connection 582, such as for providing electrical conduction between electrically conductive pad 522 and another electrically conductive structure.

Related to FIG. 5, FIG. 6 is a schematic cross section view of an interposer having an electrically conductive pad formed on one side; a trace pad, trace, and interposer contact pad formed on another sides; and an electrical connection between the electrically conductive pad and the trace pad, prior to forming a pressure contact. Also related to FIG. 5, FIG. 7 is a top section view of a trace pad, trace, and interposer contact pad prior to forming a pressure contact. FIG. 7 shows structure 700 having interposer contact pad trace 512, trace length 572, and flat trace pad 571. FIG. 7 also shows conductive connection 582 for electronically connecting structure 700 (e.g., such as flat trace pad 571 of structure 700) to electrically conductive pad 522, such as via hole 592 having RAD 2, as shown in FIG. 6.

According to embodiments the following measurements as identified in FIGS. 5-7 may be representative of the physical dimensions as identified in FIGS. 5-7 or may be representative of the corresponding features in structures 200 as shown in FIG. 2 after formation of dome 221. Thus, electrically conductive pad 522 may have RAD 1 between 2.5 mils and 25 mils, and flat trace pad 571 may have radius RAD 3, and interposer contact pad trace 512 may have radius RAD 4 similar to RAD 1. Thus, width W1 may be a width of between five mils and 50 mils in width, and length L1 may be a length of between 10 mils and 350 mils in length. In addition, trace length 572 may have width W2 of between two mils and 150 mils in width, and hole 592 may have radius RAD 2 of between one mil and 5 mils. Although FIG. 7 shows width W2 less than width W1, in accordance with embodiments, width W2 may be greater than width W1, such as by being greater than width W1 so that structure 700 forms a "football" shape that is thickest in the middle (e.g., at width W2) and narrows at the ends (e.g., at the radii of flat trace pad 571 and contact pad trace 512, distal from width W2). Note that measurements provided above for radii RAD 1, RAD 2, RAD 3, and RAD 4; widths W1 and W2; and length L1 are representative.

FIG. 6 also shows interposer 510 having first thickness T1 which may be a thickness of between one mil and 20 mils (e.g., such as a thickness of 20 mils), electrically conductive pad 522 having second thickness T2 between 0.5 mils and 5 mils (e.g., such as a thickness of 2 mils), and interposer contact pad trace 512 having third thickness T3 between 0.5 mils and 5 mils (e.g., such as a thickness of 2 mils). According to embodiments flat trace pad 571 may have fourth thickness T4 similar to third thickness T3, and trace length 572 may have fifth thickness T5 of between 0.25 mils and five mils (e.g., such as a thickness of 2 mils). Note that thicknesses T1 through T5 are representative thicknesses.

Accordingly, structures 200 and/or 400 (e.g., of apparatus 100 (see FIGS. 2 and 3)) may be formed by forming structures 700 aligned on a first side of interposer 510, forming electrically conductive pads 522 on a second side of interposer 510, and forming electrical connections such as conductive connections 582 between the electrically conductive pads and the flat trace pads, such as to form structure 600 shown in FIG. 6. It can be appreciated that structures 700 and electrically conductive pads 522 may be formed by PCB fabrication techniques for producing two-sided flexible circuitry, including print and etch technology, pattern and etch technology, screen printed conductor technology, and/or a combination thereof. Next, structure 600 can be formed into a three dimensional pressure contacts at electrically conductive pad 522, such as to form pressure contact 122 as shown in structures 200 and/or 400 (see FIGS. 2 and 3). For example, structure 600 may be formed into structure 200, such as by using a pressure fixture, a pressure platen, a temperature fixture, a temperature platen, and/or by techniques to form structure 200 with pressure contacts 221 having a shape and functional characteristics as described herein.

Consequently, upon forming three dimensional pressure contacts, such as structure 200, it is to be appreciated that interposer 510 may be transformed into interposer 110, flat trace pad 571 may be transformed into trace pad 271, trace length 572 may be transformed into trace 272, interposer contact pad trace 512 may be transformed into interposer contact pad 112, conductive connection 582 may be transformed into connection 282, hole 592 may be transformed into hole 292, and electrically conductive pad 522 may be transformed into pressure contact 122 having contact surface 142.

Figure 8:
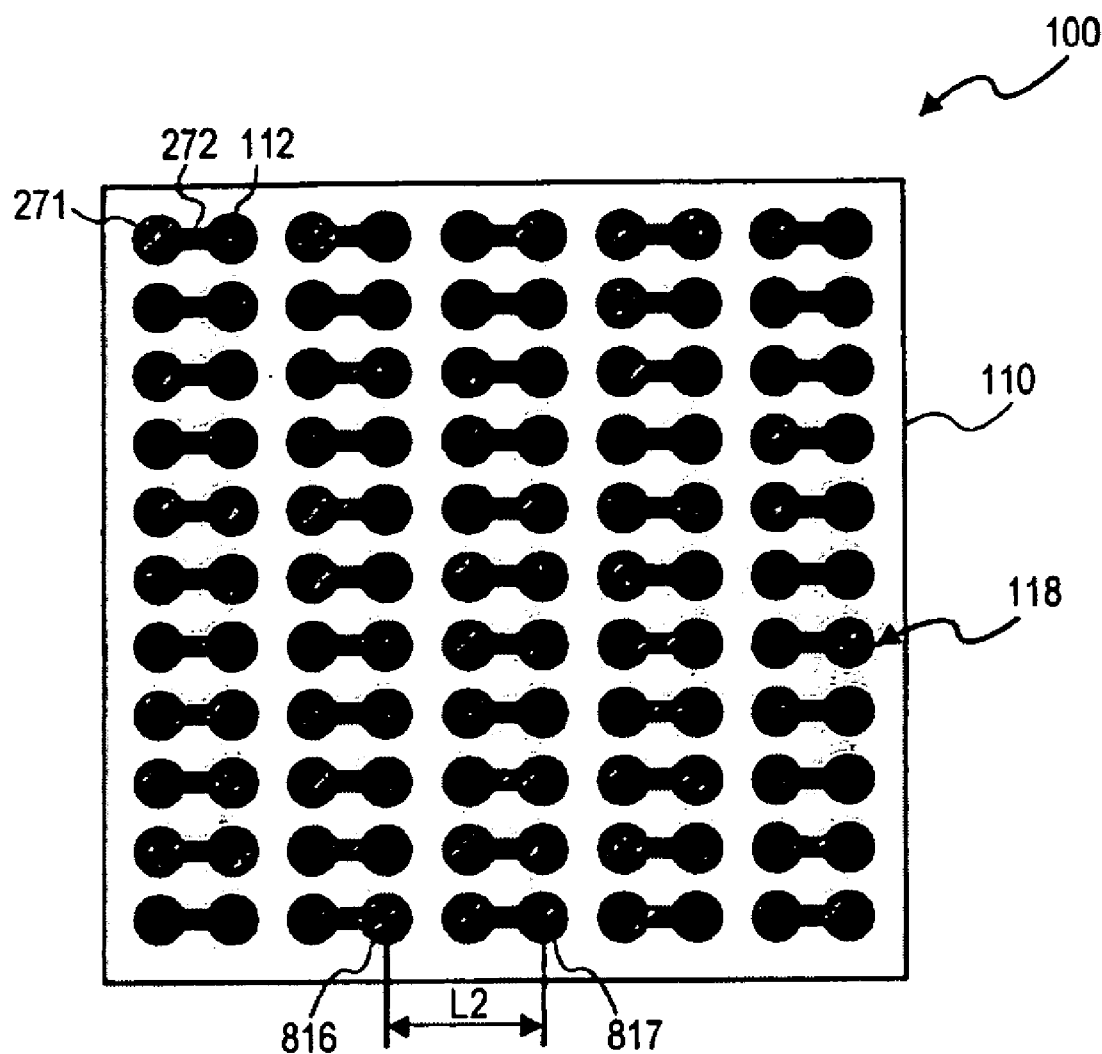
FIG. 8 is a bottom section view of a first surface of an interposer for connecting to a field or array of contacts of a first electronic device.

FIG. 8 is a bottom section view of a first surface of an interposer for connecting to a field or array of contacts of a first electronic device (e.g., first electronic device 130 shown in FIG. 1). FIG. 8 shows first side 118 of interposer 110 having a 5×11 array or geographic pattern of trace pad 271, trace 272, and interposer contact pad 112 combinations, wherein each combination defines a "dog-bone" or dumbbell shape. FIG. 8 also shows a spacing L2 of between 20 mils and 80 mils (e.g., such as the spacing between contact pads or pins of a device described above for first device 130 or second device 160) between a first interposer contact pad 816 (e.g., such as a pad sufficient to conduct electricity to and from a first contact of an electronic device) and a second adjacent interposer contact pad 817 (e.g., such as a pad sufficient to conduct electricity to and from a second contact of the same electronic device). It can be appreciated that interposer contact pads 816 and 817 may be similar to interposer contact pad 112 as described above, such as by including attachment surfaces that may be permanently attached to contact surfaces of a PBA by solder or conductive paste. In addition, although FIG. 8 shows a 5×11 array, it is contemplated that apparatus 100 may be formed with first side 118 having a larger or smaller size and/or population of interposer contact pad for contacting or electronically interfacing with electronic devices having variously sized and populated arrays of contacts. For example, apparatus 100 may include interposer contact pads 112 for contacting pressure contacts or permanent contacts of a 25×25 array or grid of an electronic device, such as a PBA.

Figure 9:
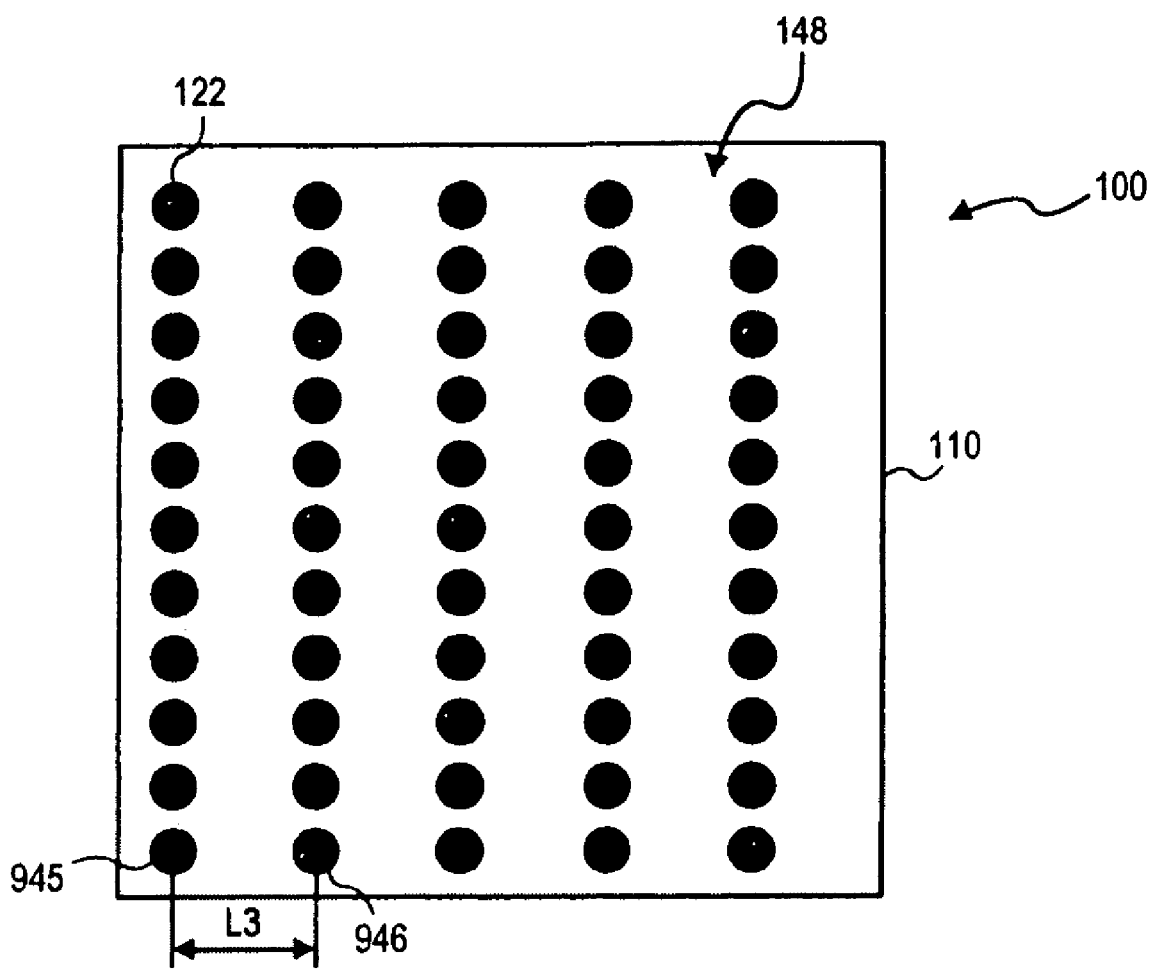
FIG. 9 is a top section view of a second surface of an interposer for connecting to a field or array of connectors of a second electronic device.
Figure 10:
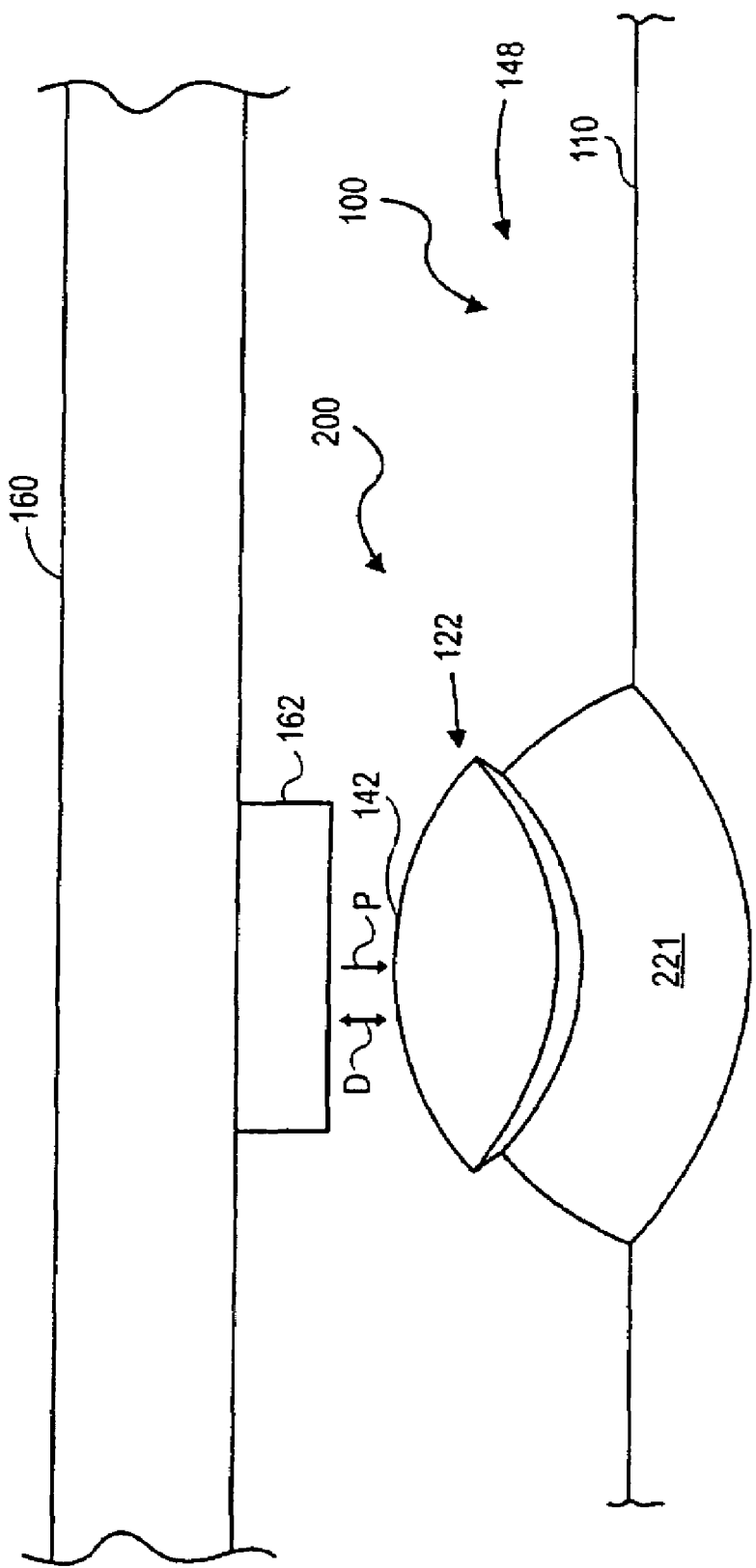
FIG. 10 is a three-dimensional top perspective view of FIG. 2.

FIG. 9 is a top section view of a second surface of an interposer for connecting to a field or array of contacts of a second electronic device (e.g., second electronic device 160 illustrated in FIG. 1). FIG. 9 shows second 148 of interposer 110 having a 5×11 array or geographic pattern of pressure contacts 122. FIG. 9 also shows a spacing L3 of between 20 mils and 80 mils (e.g., such as the spacing between contact pads or pins of a device described above for first device 130 or second device 160) between a first pressure contact 945 (e.g., such as a pad sufficient to conduct electricity to and from a first contact of an electronic device) and a second adjacent pressure contact 946 (e.g., such as a pad sufficient to conduct electricity to and from a second contact of the same electronic device). It can be appreciated that pressure contacts 945 and 946 may be similar to pressure contact 122 as described above, such as by including attachment surfaces that may be removably attached to contact surfaces of a PBA by solder or conductive paste. In addition, although FIG. 9 shows a 5×11 array, it is contemplated that apparatus 100 may be formed with second side 148 having a larger or smaller size and/or population of pressure contacts for contacting or electronically interfacing with electronic devices having variously sized and populated arrays of contacts. For example, apparatus 100 may include pressure contacts 122 for contacting pressure contacts or permanent contacts of a 25×25 array or grid of an electronic device, such as a LGA. Hence, according to embodiments, apparatus 100 may be configured so that interposer contact pads 112, as shown in FIG. 8 and pressure contacts 122, as shown in FIG. 9 simultaneously physically align and electronically connect a corresponding pattern of contacts of a first electronic device on one side of apparatus 100 to those of a second electronic device on the other side of apparatus 100.

Hence, apparatus 100 may include pressure contacts 122 on one side of the apparatus having an axis or center separated a distance of between 2.5 mils and 75 mils in distance from an axis or center interposer contact pads 112 on the other side of the apparatus (e.g., such as for pressure contacts 122 and interposer contact pads 112, as shown in FIGS. 1, 4, 8, and 9). Similarly, it is contemplated that a center of radius RAD1 may be a distance of 5, 10, 15, 25, 30, 40, 50, 60, or 70 mils from the center of radius RAD4, as shown in FIGS. 5-7.

According to embodiments, various adaptations and alterations of the structures shown in FIGS. 1-9 are contemplated. For example, those familiar with the industry or field of the art will recognize that, with respect to FIG. 2, trace pad 271, trace 272, and interposer contact pad 112 combinations, may be formed on both, first side 118 and second side 148 of interposer 110. Thus, conductive connection 282 may be disposed through a hole extending from first side 118 to second side 148 of interposer 110 at interposer contact pad 112, as well as/or instead of where shown in FIG. 2. Also, it is contemplated that dome 221 could be formed in a downward manner at interposer contact side 112 instead of where it is shown formed in FIG. 2. In addition, the structure shown in FIG. 2 or the structure described above with dome 221 formed at interposer contact pad 112 may be inverted so that second side 118 is above second side 148, such as an orientation opposite that shown in FIG. 2. Finally, trace pad 271 and trace 272 may be formed on second side 148 of interposer 110 and attach to pressure contact 122. Thus, trace pad 271 may be attached to contact pad 112 via a conductive connection 282 disposed through a hole extending from first side 118 to second side 148 of interposer 110 at interposer contact pad 112. Moreover, combinations of the adaptations and alterations described above may be formed.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising:
   forming a plurality of electrically conductive pads on a first side of a formable planar base, the electrically conductive pads aligned on the first side to electronically connect to a first device;
   forming a plurality of electrically conductive structures on a second side of the formable planar base;
   forming a plurality of electrical connections through the formable planar base from the electrically conductive pads to the electrically conductive structures;
   forming a plurality of three-dimensional pressure contacts in the formable planar base at the plurality of electrically conductive pads,
   wherein the three-dimensional pressure contacts are directionally deformable in a direction between the electrically conductive pads and the second side, and are configured to removably electronically connect to the first device, wherein forming the plurality of three-dimensional pressure contacts includes one of a pressure fixture, a pressure platen, a temperature fixture, and a temperature platen.

2. The method of claim 1, wherein forming the electronically conductive pads and the electrically conductive structures includes one of a print and etch process, a pattern and etch process, and a screen printed conductor process.

3. The method of claim 1, wherein the generally planar interposer has a thickness of between 1 mil and 20 mils, and includes a layer of one of a polyimide, a polyester, a polycarbonate, a Mylar®, a polyvinyl chloride (PVC), a cellulose acetate, and a plastic material; wherein the contact surface has a thickness of between 0.5 mils and 5 mils, and includes a conductor material having a surface plated or coated with a metal; and wherein the interposer contact pads have a thickness of between 0.5 mils and 5 mils.

4. The method of claim 1, wherein sets of one each of the electrically conductive pads, the electrical connections, and the conductive structures define a dog-bone or dumbbell shape.

5. The method of claim 1, wherein each of the electrical connections include one of a plated through hole and a conductive filler in a hole.

6. A method comprising:
   forming a plurality of electrically conductive pads on a first side of a formable planar base, the electrically conductive pads aligned on the first side to electronically connect to a first device;
   forming a plurality of electrically conductive structures on a second side of the formable planar base;
   forming a plurality of electrical connections through the formable planar base from the electrically conductive pads to the electrically conductive structures;
   forming a plurality of three-dimensional pressure contacts in the formable planar base at the plurality of electrically conductive pads,
   wherein the three-dimensional pressure contacts are directionally deformable in a direction between the electrically conductive pads and the second side, and are configured to removably electronically connect to the first device, wherein the pressure contacts include a plurality of flexible three-dimensional domes formed in the generally planar interposer under the pressure contacts.

7. A method of assembly comprising:
   forming an electrical connection between a plurality of interposer contact pads aligned on a first side of a generally planar interposer and a plurality of first contacts of a first electronic device;
   forming a removable electrical connection between a plurality of pressure contacts formed in the interposer and a plurality of second contacts of a second electronic device, the pressure contacts having a contact surface on the second side of the interposer to removably contact the plurality of second contacts of a second electronic device, the interposer having a plurality of electrical connections between the interposer contact pads and the pressure contacts;
   directionally deforming the pressure contacts and the contact surface in a direction from the second side of the generally planar interposer towards the first side, further comprising applying a pressure to the top surface to flex the pressure contact from a first height in distance from a top surface of the contact surface to the first side of a generally planar interposer to a second height in distance from a top surface of the contact surface to the fist side of the interposer, wherein the second height is less than the first height.

8. The method of claim 7, further comprising simultaneously physically aligning and simultaneously electronically connecting the first contacts with the second contacts.

9. The method of claim 8, further comprising simultaneously electronically connecting a plurality of contact pads of a land grid array (LGA) and a plurality of contact pads of a printed circuit board (PCB).

10. The method of claim 7, further comprising the pressure contacts complying under a contact pressure applied to the contact surface of between 0.2 Newton and 0.6 Newton in pressure applied to the pressure contacts without permanently deforming or damaging the pressure contacts.

11. The method of claim 7 wherein the pressure contacts have a modulus of elasticity greater than the pressure applied.

12. The method of claim 7, further comprising flexing a plurality of domes of the pressure contacts in response to a pressure applied to the pressure contacts without permanently deforming or damaging the pressure contacts.

13. The apparatus of claim 7, wherein each pressure contact has a pressure attachment surface to removably attach to a second contact, and there is a spacing of between 20 mils and 80 mils in distance between adjacent pressure attachment surfaces.

14. A method of assembly comprising:
forming an electrical connection between a plurality of interposer contact pads aligned on a first side of a generally planar interposer and a plurality of first contacts of a first electronic device;
forming a removable electrical connection between a plurality of pressure contacts formed in the interposer and a plurality of second contacts of a second electronic device, the pressure contacts having a contact surface on the second side of the interposer to removably contact the plurality of second contacts of a second electronic device, the interposer having a plurality of electrical connections between the interposer contact pads and the pressure contacts;
directionally deforming the pressure contacts and the contact surface in a direction from the second side of the generally planar interposer towards the first side, further comprising permanently attaching a conductive material without a metal coating or plating of the interposer contact pads to the first contacts by one of solder, conductive paste, and conductive adhesive.

15. A method comprising:
forming a plurality of electrically conductive pads on a first side of a formable planar base;
forming a plurality of electrically conductive structures on a second side of the formable planar base;
forming a plurality of electrical connections through the formable planar base from the electrically conductive pads to the electrically conductive structures;
forming a plurality of three-dimensional pressure contacts in the formable planar base at the plurality of electrically conductive pads, wherein the pressure contacts include a plurality of flexible three-dimensional domes formed in the generally planar interposer under the pressure contact.

16. The method of claim 15, wherein the three-dimensional pressure contacts are directionally deformable in a direction between the electrically conductive pads and the second side.

17. The method of claim 15, wherein the electrically conductive structures comprise a contact pad aligned on the second side to electronically connect to a first device and the three-dimensional pressure contacts are configured to removably electronically connect to a second device.

18. The method of claim 15, further comprising a plurality of three-dimensional domes formed in the generally planar interposer under the pressure contacts, wherein the pressure contacts and the three-dimensional domes flex in response to a pressure applied to the pressure contacts without permanently deforming or damaging the pressure contacts or domes.

19. The method of claim 15, wherein forming the plurality of three-dimensional pressure contacts includes one of a pressure fixture, a pressure platen, a temperature fixture, and a temperature platen.

* * * * *